(12) United States Patent
Mansoorian et al.

(10) Patent No.: US 10,297,630 B2
(45) Date of Patent: May 21, 2019

(54) PINNED CHARGE TRANSIMPEDANCE AMPLIFIER

(71) Applicants: Barmak Mansoorian, Pasadena, CA (US); Ramy Tantawy, Pasadena, CA (US)

(72) Inventors: Barmak Mansoorian, Pasadena, CA (US); Ramy Tantawy, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 27 days.

(21) Appl. No.: 13/919,913

(22) Filed: Jun. 17, 2013

(65) Prior Publication Data

US 2013/0341490 A1 Dec. 26, 2013

Related U.S. Application Data

(60) Provisional application No. 61/654,271, filed on Jun. 18, 2012.

(51) Int. Cl.
| | |
|---|---|
| *H01L 27/00* | (2006.01) |
| *H01L 27/146* | (2006.01) |
| *H04N 5/347* | (2011.01) |
| *H04N 5/3745* | (2011.01) |

(52) U.S. Cl.
CPC ....... *H01L 27/14634* (2013.01); *H04N 5/347* (2013.01); *H04N 5/37457* (2013.01)

(58) Field of Classification Search
CPC . H01L 27/146; H01L 27/14634; H04N 5/347; H04N 5/37457

USPC ............... 250/208.1; 257/226; 348/300, 301
See application file for complete search history.

(56) References Cited

U.S. PATENT DOCUMENTS

| | | | | |
|---|---|---|---|---|
| 8,969,780 B2* | 3/2015 | Dupont | ............ | H01L 27/14641 |
| | | | | 250/214 R |
| 2004/0096124 A1* | 5/2004 | Nakamura | .................... | 382/308 |
| 2006/0050160 A1* | 3/2006 | Suzuki | ............. | H01L 27/14634 |
| | | | | 348/294 |
| 2006/0165294 A1* | 7/2006 | Mizuno | ..................... | G01J 1/44 |
| | | | | 382/224 |
| 2006/0231733 A1* | 10/2006 | Boemler | .................... | 250/208.1 |
| 2009/0046189 A1* | 2/2009 | Yin et al. | ...................... | 348/308 |
| 2009/0289169 A1* | 11/2009 | Yang et al. | ................ | 250/201.2 |
| 2010/0282946 A1* | 11/2010 | Yin et al. | .................. | 250/214 A |

(Continued)

FOREIGN PATENT DOCUMENTS

WO     WO 2004105137 A1 * 12/2004 ....... H01L 27/14634

*Primary Examiner* — Thanh Luu
*Assistant Examiner* — Kevin Wyatt
(74) *Attorney, Agent, or Firm* — Law Office of Scott C Harris, Inc

(57) ABSTRACT

A system that has plural different photodetector circuits, each photodetector circuit including its own transfer gate, and each of the plural different photodetector circuits and transfer gates commonly connected to a first node. In amplifier is used which maintains a fixed voltage edits input. The amplifier Has a first capacitance to ground in a second capacitance as a feedback between its output and input. In one embodiment, there are 16 photodetector circuits connected to the single amplifier. In embodiments, the photodetector circuits can be located in one substrate while the amplifier is located in another substrate, and the amplifier also minimizes parasitics between the substrates.

21 Claims, 3 Drawing Sheets

(56) References Cited

U.S. PATENT DOCUMENTS

2013/0048832 A1\* 2/2013 Peizerat ............ H01L 27/14634
250/208.1
2013/0126708 A1\* 5/2013 Blanquart .................. 250/208.1
2013/0277534 A1\* 10/2013 Watanabe ......... H01L 27/14806
250/208.1

\* cited by examiner

PINNED CHARGE TRANSIMPEDANCE AMPLIFIER

This application claims priority from Provisional application No. 61/654,271 filed Jun. 18, 2012, the entire contents of which are herewith incorporated by reference.

BACKGROUND

CMOS image sensors are continually being improved in different ways.

A first issue in CMOS image sensors is fill factor. Increasing pixel fill factor leads to desirable increases in pixel sensitivity and/or full well. An improvement in fill factor can also be traded off with reduced pixel size while retaining the same fill factor.

Primary methods of improving fill factor have been, using backside illumination technology, moving to a smaller geometry process, and sharing components of a pixel across several pixels.

SUMMARY

The present application describes a new pixel structure using a charge trans-impedance amplifier.

Embodiments describe placing different parts of the pixel structure on different substrates, connecting the substrates together, and using the amplifier to minimize parasitics (e.g. stray capacitance) between the substrates.

DETAILED DESCRIPTION

Figure 1:
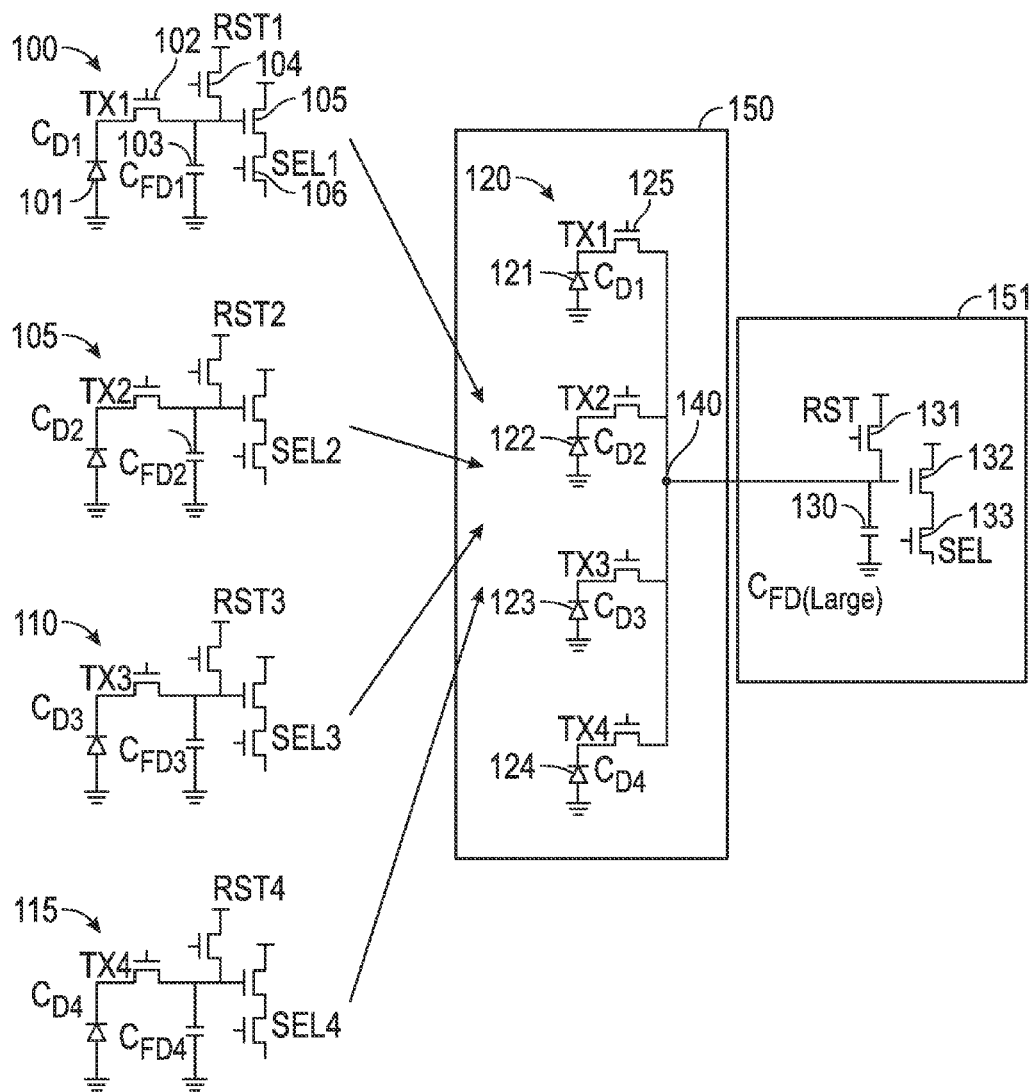
FIG. 1 shows a circuit with transistors shared between pixels.

FIG. 1 shows an embodiment where four (4) pixels share the same reset, select, and source follower transistors to achieve a lower overall number of transistors across the four (4) pixel group.

The left side of FIG. 1 shows the individual pixels. Individual pixels include pixels 100, 105, 110 and 115. Each pixel such as 100 includes a pinned photodiode photoreceptor 101, coupled to a transfer gate 102. The transfer gate connects to a capacitor 103 that forms the sample and hold circuit and also carries out the sampling. There is also a reset transistor 104, a source follower 105, and to select transistor 106. Each of the pixels 100 through 115 includes the same set structure. In the combined pixel system shown in 120, there are individual photodetectors 121, 122, 123 and 124. Each photodetector such as 121 includes its own transfer gate 125. However, the output of all the transfer gates 125 goes to a shared capacitor 130, reset transistor 131, source follower transistor 132 and select transistor 133.

However, sharing pixels leads to a large parasitic capacitance at the shared floating diffusion node CFD 140. The conversion gain (conversion ratio between output signal voltage and input electrons) of the pixel is inversely proportional to this capacitance. This sets an upper limit to the number of pixels that can practically be grouped without significantly attenuating the output signal from the pixel. This upper limit is typically four (4) pixels per group. This means that the average number of transistors per pixel will be 1.75 (7 transistors shared across 4 pixels).

This leads to a trade-off between the conversion gain and the noise of the source follower amplifier. The source follower amplifier's 1/f, RTN noise (and their noise distributions) is lowered by making the size of the source follower larger. However, a larger source follower increases the capacitance of the floating diffusion node, lowering the conversion gain.

However, in the case of the approach described in the embodiments, the amplifier's input transistors can be sized to optimize the noise rather than their effect on the conversion gain (because the conversion gain is not dependent on the input capacitance). Embodiments describe an amplifier circuit whose transistors can be sized without trading off noise and conversion gain.

A stacked sensor approach is described where the detector arrays's fabrication process can be simplified by reducing the number of transistor types in the wafer.

An image sensor is described where multiple independent detectors integrate the optical signal are connected to a single amplifier in another substrate.

Binning is the process of combining the signal from several pixels. Binning can obtain higher sensitivity at low signal levels. To achieve the best performance for higher sensitivity, the binning should be done in the charge domain. If the binning is done in the voltage domain after a pixel is read, the noise from each read are summed (in root mean square) and then reduce the effectiveness of binning for higher sensitivity.

Figure 2:
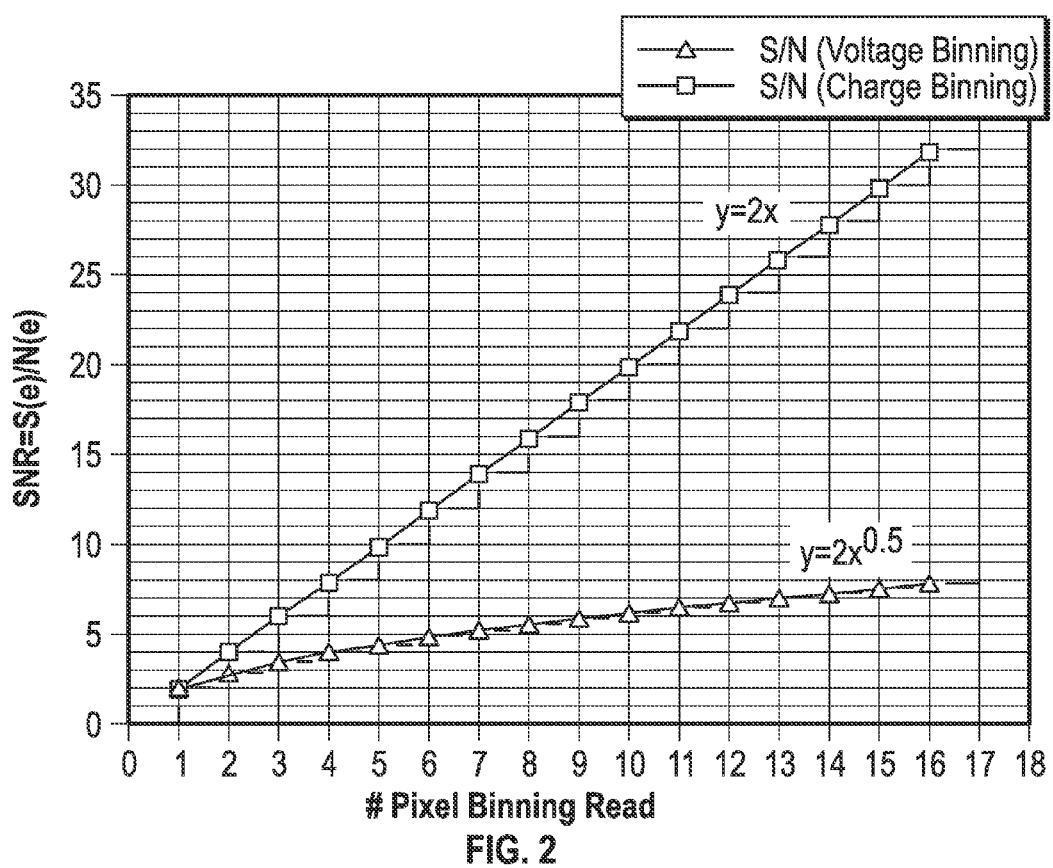
FIG. 2 shows SNR comparisons.

The sensor frame rate of a CMOS pixel can be done by reading out fewer pixels while keeping the field of view the same as if the entire frame was being read out. Charge domain binning is also most effective in this case, because binning in the voltage domain after pixel read adds the delay of each read cycle. This works counter to increasing the sensor frame rate. FIG. 2 illustrates a graph showing the improvement in signal to noise ratio (SNR) with charge binning compared to voltage binning. Voltage binning suffers from additional noise from each read operation.

Binning in color format image sensors has not been very effective because of the combination of the grouping limitation (described above) and the Bayer color filter array typically used in image sensors.

Figure 3:
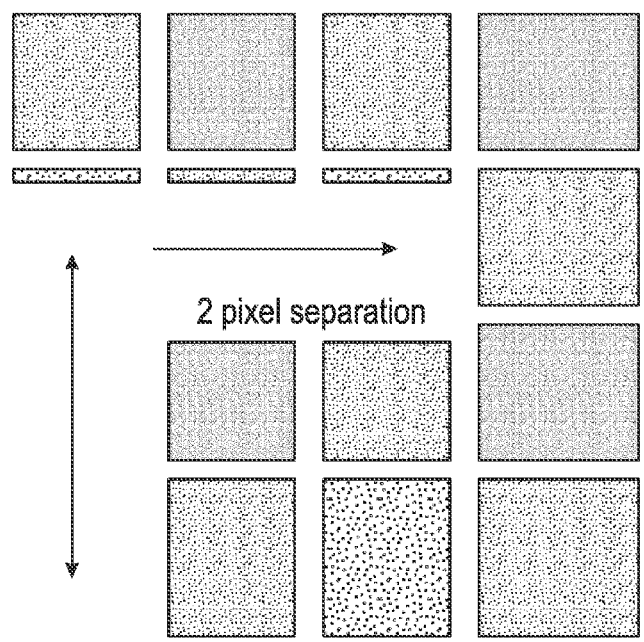
FIG. 3 shows a Bayer color filter.

FIG. 3 shows the layout of the color filter array (CFA) in a Bayer pattern. In this arrangement, the red and blue pixels are separated from each other. In a four (4) pixel grouping arrangements (described in (1), above), it would not be possible to bin the red and blue pixels in the charge domain.

Therefore, binning in CMOS image sensors has been confined to binning in the voltage domain after the pixels have been read out. This significantly reduces the benefits of binning in CMOS image sensors for improved sensitivity and frame rate.

The pixel supply voltage of the FIG. 1 embodiment is limited because of the structure of the pixel, referred to herein as a "4T pixel". 4T pixels' good noise performance is predicated on full charge transfer from the "pinned" photodiode 121 to the floating diffusion capacitor 130. For this transfer, the floating diffusion node 130 needs to be above the "pinning" voltage of the photodiode, even after full transfer of the signal charge to avoid charge sharing—and its associated nonlinearity—between the two nodes. Practical process considerations limit the "pinning" voltage to above 1 volt. Typical voltage swings at the floating diffusion node are also approximately 1 volt.

This combination sets a practical lower supply voltage of >1.2 volts (typical in many mobile applications) on the pixel—even without consideration of the voltage drop across the source follower or selection transistor.

This requirement creates the need for additional voltage supplies in many camera systems—specially in mobile applications.

Figure 4:
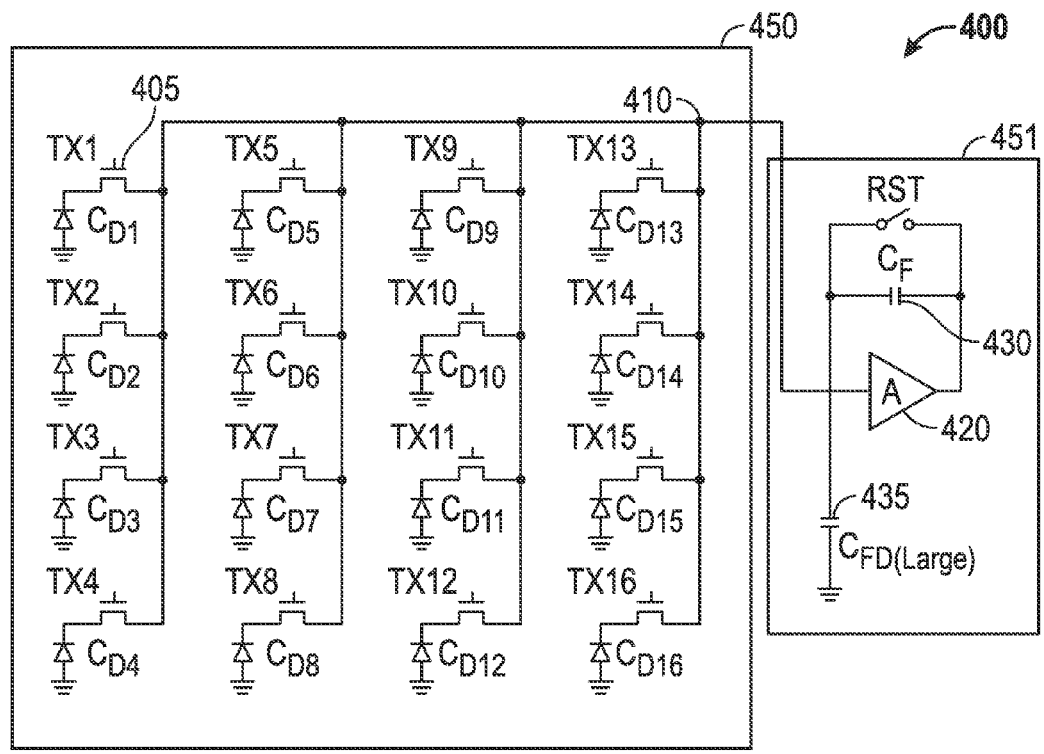
FIG. 4 a pixel with shared pixels.

FIG. 4 shows an embodiment of a new pixel structure of an embodiment. FIG. 4 shows a 16 shared pixel.

The pixel includes 16 photoreceptors shown as CD1-CD16. Each of the photoreceptors is a pinned photodiode. Each individual portion of the pixel includes a pinned photodiode such as CD 1 400, and an individual transfer gate such as TX 1 405. The photoreceptors CD 1-CD16 are commonly connected by the transfer gates TX 1-TX 16 to the node 410.

However, in this embodiment, there is a special amplifier shown as 420. Amplifier 420 holds the voltage at the CFD node 410 constant. The CFD node is at the virtual ground of the amplifier 420. Because of the large gain of the amplifier and the negative feedback of the circuit through the feedback capacitor 430, the amplifier will try to keep the CFD node at a reference voltage. Depending on the amplifier type (single ended or differential input), this reference voltage is either set by the amplifier's self-generated bias point or an externally supplied voltage.

All the signal charge from the selected photodiode, e.g., 400 is forced to the feedback capacitor CF 430. Therefore, the signal is not attenuated by the large CFD capacitor 435. The CF capacitor 430 determines the conversion gain of the device that can remain constant regardless of the number of pixels connected to that node.

As opposed to a classical CTIA implementation, the amplifier 420 is not holding the photodiode bias itself constant. Therefore the photodiode 400 can be disconnected from the amplifier during integration and multiple detectors can share the same amplifier.

Moreover, the CTIA amplifier, can nullify or reduce the effects of the parasitics (in this case capacitance) between two bonded wafers.

The ratio of CF 430 to CFD 435 does increase the noise of the readout amplifier. But this is only with a square root dependency. In addition, the noise of the amplifier can be made low by minimizing its bandwidth and using sub-threshold operation.

This new structure has the following advantages.

Large binning ratios in the charge domain—because the number of binned devices can be increased to 16 (and beyond, depending on the performance of the amplifier), color binning becomes possible. This is because in a 4×4 shared arrangement, red and blue pixels do not need to be immediately adjacent to each other for binning.

In monochrome devices, larger binning ratios can also be achieved in the charge domain.

Because the binning in performed in parallel at the pixel level, the frame rate will increase in proportion to the binning ratio.

Higher fill factor—For backside illuminated sensors (BSI), the amplifier, CF and RST switches can be placed in a separate substrate and bump-bonded to a detector substrate. There may be other wafer bonding approaches besides bump bonding—for example Direct Bonding (as per Ziptronix Corp.) This will not degrade the performance of the pixel due to insensitivity to stray capacitance at the CFD node. Placing these components on another substrate has the benefit of reducing the average transistor count to 1 per pixel on the detector substrate. In turn, this allows for a significantly higher fill factor and/or smaller pixel size for the pixels.

Lower supply voltage—the amplifier's feedback network keeps the voltage at the floating diffusion network constant even after charge transfer (the charge is transferred to the feedback capacitor). Therefore, the minimum supply voltage of this pixel technology can be made very close to, 20% of, e.g., within the pinning voltage of the photodiode rather than the pinning voltage plus the change in voltage at the floating diffusion node required in the 4T structure.

Also, since there are different substrates, and different circuits in the substrates, the number of different types of transistors in the substrates can be minimized. For example, in FIG. 4, there can be a first substrate 450. The first substrate 450 has only 2 transistor types in it, the pinned diodes such as 400, and the transfer gate such as 405. The second substrate 451 includes the amplifier, and may have only the capacitors and the amplifier types in it. In FIG. 1, the first substrate 150 can have the pixels, and second substrate have the reset 131 and transistors. This simplifies the structure by reducing the number of types of transistors in the substrate. For example, in the embodiment shown in FIG. 4, there may be a two different kinds of transistors in each of the substrate 450 and 451, although the substrate 451 will need to have capacitors also.

Alternatively, the substrates may have a single kind of transistor as in 150/151.

The system can carry out variable conversion gain/full well—the feedback capacitor CF can be programmed to assume low or high capacitor value. Programming can be carried out by using multiple switchable capacitors or a voltage controlled capacitor to vary the conversion gain or full well.

Global shutter operation—By putting multiple sample and hold capacitors in the second substrate (in front of the amplifier), the proposed architecture can function in a global shutter architecture with:

This pixel also has low read noise, high shutter efficiency, low dark current, and programmable full well.

High dynamic range operation—sample pixels can be inter-dispersed with signal pixels. The sample pixels can be sampled first to adjust the feedback capacitor in anticipation for reading the signal pixels.

FIGS. 5A and 5B illustrate the fill factor for a 2.2μ pitch pixel. The structure of FIG. 1 is shown in FIG. 5A, which shows how the fill factor can be between 50 and 60%. FIG. 5B shows how the structure of FIG. 4 can have a 90% fill factor. Moreover, this new architecture has less sensitivity to the capacitance on the shared node, and allows the shared amplifier to be in the same or in a separate substrate.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of circuits can be controlled in this way.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system comprising:
a first substrate, having plural different pinned photodiode photodetector circuits, each photodetector circuit including its own transfer gate, and each of the plural different photodetector circuits and transfer gates commonly connected to a first node, where the first node is on the first substrate;
a second substrate, separate from the first substrate, connected directly to said first node, said second substrate including:
a first capacitance, connected to said first node;
a fixed voltage amplifier, having an input which is maintained at a constant and fixed voltage, and having an integrating capacitor connected between said input and an output of said fixed voltage amplifier, said fixed voltage amplifier receiving a voltage at said input which is sent from any of said photodetectors by closing one of said transfer gates, where the integrating capacitor is a lower capacitance than the first capacitance; and
a reset controller for said integrating capacitor,
each of the transfer gates on the first substrate being deactivated during integration by an associated photodetector circuit, such that the associated photodetector circuit is not connected to said amplifier during said integration, and where each transfer gate is activated for a pixel to carry out integration by the associated photodetector circuit, and where during integration, substantially all signal charge from a pixel is forced to the integrating capacitor.

2. The system as in claim 1, wherein said fixed voltage amplifier is a trans-impedance amplifier.

3. The system as in claim 1, wherein there are 16 of said photodetector circuits connected to said first node.

4. The system as in claim 1, further comprising a power supply whose output is within 20% of a pinning voltage of the pinned diode.

5. The system as in claim 1, further comprising a select transistor on the second substrate, selecting the photodetector circuits on the first substrate.

6. The system as in claim 5, wherein said amplifier actively manages to reduce a capacitance between said first substrate and said second substrate.

7. The system as in claim 5, wherein said first substrate is bonded to said second substrate.

8. A system comprising:
a first substrate having plural different photodetector circuits, each said photodetector circuit including a pinned diode photodetector and an individual transfer gate for each pinned diode photodetector, and each of the plural different photodetector circuits and transfer gates commonly connected to a first node that is on the first substrate;
a first capacitance, connected to said first node; and
a second substrate, bonded to said first substrate and having a fixed voltage amplifier which maintains the first node at a constant and fixed voltage and also amplifies a signal and also minimizes an effect of parasitics between said first and second substrate, and said second substrate also having a reset controller that resets an integrated value from said photodetector circuits, where the fixed voltage amplifier has an integrating capacitor is a lower capacitance than the first capacitance;
each of the transfer gates on the first substrate being deactivated during integration by an associated photodetector circuit, such that the associated photodetector circuit is not connected to said amplifier during said integration, and where each transfer gate is activated for a pixel to carry out integration by the associated photodetector circuit, and where during integration, substantially all signal charge from a pixel is forced to the integrating capacitor.

9. The system as claim 8, wherein said parasitics includes capacitance, and said amplifier minimizes capacitance between said first and second substrates.

10. The system as in claim 8, wherein said amplifier has an input which is maintained at a fixed voltage, and having a capacitor connected between said input and an output of said amplifier, said fixed voltage amplifier receiving a voltage at said input which is sent from any of said photodetectors by closing said transfer gate.

11. The system as in claim 8, further comprising a select transistor on the second substrate, selecting the photodetector circuits on the first substrate.

12. The system as in claim 8, wherein each of the substrates has less than a specified number of transistor types therein.

13. The system as in claim 12, wherein each of the substrates has two or less types of transistors therein.

14. The system as in claim 8, wherein there are 16 of said photodetector circuits connected to said first node.

15. The system as in claim 8, wherein each of the substrates has less than a specified number of transistor types therein.

16. The system as in claim 15, wherein each of the substrates has 2 or less types of transistors therein.

17. An image sensor system, comprising:
a first substrate having multiple different independent pinned diode photodetectors which each obtain an optical signal, and are grouped into a group, where one of said detectors at a time is selectable, wherein said first substrate having plural different photodetector circuits, each photodetector circuit including its own transfer gate, and each of the plural different photodetector circuits and transfer gates commonly connected to a first node that is on the first substrate, and
a second substrate, having at least one single amplifier, where said single amplifier is connected to said node to amplify the optical signal from said group, said second substrate also having a reset controller that resets an integrated value from said photodetector circuits and also having a select transistor on the second substrate, selecting the photodetector circuits on the first substrate;
a first capacitance, connected to said first node; and
said single amplifier on said second substrate being a fixed voltage amplifier which maintains the node at a constant and fixed voltage and amplifies the signal and also minimizes an effect of parasitics between said first and second substrate, where the fixed voltage amplifier has an integrating capacitor that is a lower capacitance than the first capacitance;
each of the transfer gates on the first substrate being deactivated during integration by an associated photodetector circuit, such that the associated photodetector circuit is not connected to said amplifier during said integration, and where each transfer gate is activated for a pixel to carry out integration by the associated photodetector circuit, and where during integration, substantially all signal charge from a pixel is forced to the integrating capacitor.

18. The system as claim 17, wherein said parasitic is capacitance, and said amplifier minimizes capacitance.

19. The system as in claim 17, wherein said amplifier has an input which is maintained at a fixed voltage, and having a capacitor connected between said input and an output of said amplifier, said fixed voltage amplifier receiving a voltage at said input which is sent from any of said photodetectors by closing said transfer gate.

20. The system as in claim 17, wherein said amplifier has transistors that can be sized without trading off noise and conversion gain.

21. The system as in claim 17, where multiple independent detectors in said first substrate integrate the optical signal and are connected to a single amplifiers in another substrate.

* * * * *